United States Patent [19]
Yan

[11] Patent Number: 5,303,002
[45] Date of Patent: Apr. 12, 1994

[54] METHOD AND APPARATUS FOR ENHANCING THE FOCUS LATITUDE IN LITHOGRAPHY

[75] Inventor: Pei-Yang Yan, Saratoga, Calif.
[73] Assignee: Intel Corporation, Santa Clara, Calif.
[21] Appl. No.: 40,678
[22] Filed: Mar. 31, 1993
[51] Int. Cl.$^5$ ............................................. G03B 27/42
[52] U.S. Cl. ........................................ 355/53; 355/55; 355/77; 430/311
[58] Field of Search .................... 355/53, 55, 71, 77; 430/311

[56] References Cited

U.S. PATENT DOCUMENTS

| | | | |
|---|---|---|---|
| 4,853,756 | 8/1989 | Matsuki | 355/71 |
| 4,869,999 | 9/1989 | Fukuda et al. | 430/311 |
| 4,904,569 | 2/1990 | Fukuda et al. | 430/311 |
| 4,937,619 | 6/1990 | Fukuda et al. | 355/53 |
| 5,001,038 | 3/1991 | Dorinski et al. | 430/311 |
| 5,091,744 | 2/1992 | Omata | 355/53 |
| 5,202,275 | 4/1993 | Sugiura et al. | 437/41 |

OTHER PUBLICATIONS

–H. Fukuda, N. Hasegawa, and S. Okazaki, "Improvement of Defocus Tolerance in a Half-Micron Optical Lithography by the Focus Latitude Enhancement Exposure Method: Simulation and Experiment," J. Vac. Sci. Technol. B7(4), pp. 667–674 (Jul./Aug. 1989).
–H. Fukuda, N. Hasegawa, T. Tanaka, and T. Hayashida, "A New Method for Enhancing Focus Latitude in Optical Lithography: FLEX," IEEE Electron Device Letters, vol. EDL-8, No. 4, pp. 179–180 (Apr. 1987).

Primary Examiner—Richard A. Wintercorn
Attorney, Agent, or Firm—Blakely, Sokoloff, Taylor & Zafman

[57] ABSTRACT

A method and apparatus for patterning a photoresist layer, with an enhanced depth of focus, is disclosed. The photoresist layer is exposed in a projection system which includes a lens having a chromatic aberration coefficient. Several closely spaced, narrow bands of radiation from an excimer are used to irradiate a mask. Each band is focused on the photoresist layer at a different focal plane along the light axis, thereby providing an increased depth of focus in a single exposure.

36 Claims, 6 Drawing Sheets

METHOD AND APPARATUS FOR ENHANCING THE FOCUS LATITUDE IN LITHOGRAPHY

FIELD OF THE INVENTION

The present invention relates to lithography, and more particularly to a method and system for enhancing the focus latitude in a lithography system.

BACKGROUND OF THE INVENTION

In the semiconductor industry, there is a continuing trend to increase device density by scaling device size. In typical state of the art devices, device dimensions are in the order of one micron, or slightly below. As the trend towards smaller, more densely packed devices continues, critical dimensions of future devices can be expected to be in the range of approximately 0.3 through 0.5 microns or smaller.

In order to achieve these reduced dimensions, improvement in lithographic performance is necessary. As is well known, the resolution (minimum feature size which can be formed in a photosensitive layer) is proportional to $\lambda/NA$, where $\lambda$ is the wavelength of the exposing radiation, and NA is the Numerical Aperture of the projection lens of the lithographic system. Therefore, in order to improve the resolution, systems using a smaller wavelength radiation (such as deep UV or X-ray, for example), and/or a larger numerical aperture, have been investigated.

In a projection lithography system, an image of the pattern on a mask or reticle (the term "mask" will be used herein to encompass any type of substrate having a pattern to be transferred) is formed by focusing the radiation exiting the mask through a lens onto the photoresist layer. The image is formed at a focal plane within the photoresist layer. This focal plane is called the plane of "best focus." Additionally, a satisfactory image is formed for a certain distance (defocus) away from the best focus. The depth of focus (DOF) is a measure, along the light axis, of this distance over which the image has sufficient contrast and intensity to define a pattern in the photoresist layer. While the depth of focus will vary based upon the lithography system and exposure parameters used, a satisfactory image can typically be formed at approximately ±2 microns defocus for features in the 1 micron range. Therefore, any portion of the photoresist layer within the depth of focus can successfully be patterned, while any portion of the photoresist which is either above or below the depth of focus will not be patterned, due either to poor contrast or insufficient exposure intensity.

The depth of focus is proportional to $\lambda/NA^2$. Therefore, the above described attempts to improve resolution by decreasing $\lambda$, or, to a greater extent, by increasing NA, will result in a reduced or shallower depth of focus. Thus, as feature size becomes smaller, depth of focus becomes a more important consideration. The effect of the depth of focus is discussed in relation to FIG. 1. FIG. 1 shows a semiconductor substrate 100, having for example metal layer 101 formed thereon and a line and space pattern in the photoresist comprising lines 102 through 106 with spaces 107 through 109 therebetween. Typically, the thickness of the resist layer is approximately 1 micron, and a satisfactory image must be maintained throughout this thickness in order to form a pattern. When the feature size is approximately in the range of 1 micron or larger (i.e., width of lines 102-106 and spaces 107-109) a printer and exposure parameters can be used which give sufficient depth of focus such that the image quality at the top level 115 and bottom level 120 has sufficient intensity and contrast. Typically, the image is focused at approximately the center of the unpatterned photoresist layer, i.e., approximately mid-way between levels 115 and 120. As mentioned above, as resolution is improved, particularly by increasing NA, the depth of focus is reduced. In a system to image photoresist wherein the dimensions of the lines and spaces are, for example, approximately 0.5 micron or below, the system will not have sufficient depth of focus to pattern the image at all points along the light axis within the photoresist. This problem is further compounded by the fact that there may be some lines and spaces, such as lines 105 and 106, and space 109, which are at a higher or lower level than other lines and spaces, due to the varying topography of the wafer. Additionally, other factors, such as warpage of the wafer, non-planarity of the stage in the lithography system, etc., may further increase the distance between the lowest level and the highest level of the photoresist layer to be patterned.

One solution to this problem, called the focus latitude enhancement exposure (FLEX) has been proposed to increase the focus latitude in projection lithography. In this method, the substrate is exposed to radiation multiple times, at different levels along the light axis. In the FLEX method, the substrate is first exposed with the pattern focused such that its focal plane is at, for example, the level 115. Next, the substrate is moved relative to the mask and lens, either by moving the substrate stage up or moving the mask/lens assembly down, and a second exposure is performed with the focal plane at the level indicated by, for example, level 120. The difference in distance between the focal planes of each of the exposures, $\Delta F$, is adjusted so that exposure intensity along the light axis is sufficient to expose the entire photoresist layer, regardless of the above described variations in topography.

FIG. 2 shows plots of intensity at various levels along the light axis 200. In the column 201, the exposure intensity along the light axis 200 is shown for a conventional, single exposure system. As shown, a well defined intensity peak is present at zero defocus. At ±1 micron along the x-axis, the intensity of the radiation has diminished but a strong peak is still present. At ±2 microns, the intensity of the exposing radiation is greatly diminished. Thus, the depth of focus extends from approximately −2 through +2 microns, giving a depth of focus of approximately 4 microns. With the FLEX method as described, two exposures, for example, at approximately −2 microns as shown in column 202 and approximately +2 micron as shown in column 203 would be performed. The combined exposure along the light axis would be as shown in column 204 which adds the exposure in columns 202 and 203. As can be seen, the depth of focus has been greatly extended, to approximately −3 through +3 microns. Further improvement in depth of focus can be achieved by performing more than two exposures. In the FLEX method, an important parameter is the distance between focal planes, $\Delta F$. If $\Delta F$ is too small (focal planes close together), then only minimal improvement in depth of focus will be achieved. Furthermore, a small $\Delta F$ together with a large number of exposures spaced by $\Delta F$ cannot be used, because the light intensity will become relatively flat (poor contrast) at any given level due to the presence of radiation from the numerous defocused images. This is particularly true for patterns where interference from neighboring patterns in present, such as closely spaced line and space patterns. On the other hand, if $\Delta F$ is too large, then the regions between the focal planes will not be exposed. Therefore, $\Delta F$ must carefully be optimized for the features being formed and the printer and exposure parameters being used, to give acceptable intensity and contrast throughout the extended depth of focus.

While the above described FLEX method increases the depth of focus, one drawback is that the multiple exposures per field which are required greatly increases process throughput time. Additionally, since plural exposures are used for single pattern, any misalignment will result in image degradation. If an alignment step is performed for each exposure, this will further increase the processes throughput time.

What is needed is a method and system for enhancing the focus latitude in lithographic systems which does not increase throughput time and preferably decreases the throughput time of the exposure process.

SUMMARY OF THE INVENTION

A method and apparatus for enhancing the focus latitude in a lithography system is described. In one embodiment of the present invention, several narrow bands of radiation from an excimer laser are used to irradiate a mask having a device pattern thereon. Each of the bands is near the intensity peak of the laser, and has a bandwidth of approximately 1-3 picometers (pm) as is typically used in excimer laser lithography. All bands are of approximately equal energy output, and are taken from an approximately 0.1 nanometer (nm) portion of the spectral bandwidth of a free running excimer laser. The bands of radiation are then focused through a lens having a chromatic aberration coefficient such that each band forms an image at a different focal plane along the light axis. The number of bands and the center wavelengths of the bands are chosen such that sufficient focal planes are present to provide for an infocus image over an extended range of distances along the light axis.

Other features and advantages of the present invention will become apparent from the detailed specification, figures and claims which follow.

DETAILED DESCRIPTION OF PRESENT INVENTION

A method and apparatus for enhancing the focus latitude in optical lithography is disclosed. In the following description, numerous specific details are set forth such as specific materials, dimensions, lithography systems, exposure parameters, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

Figure 1:
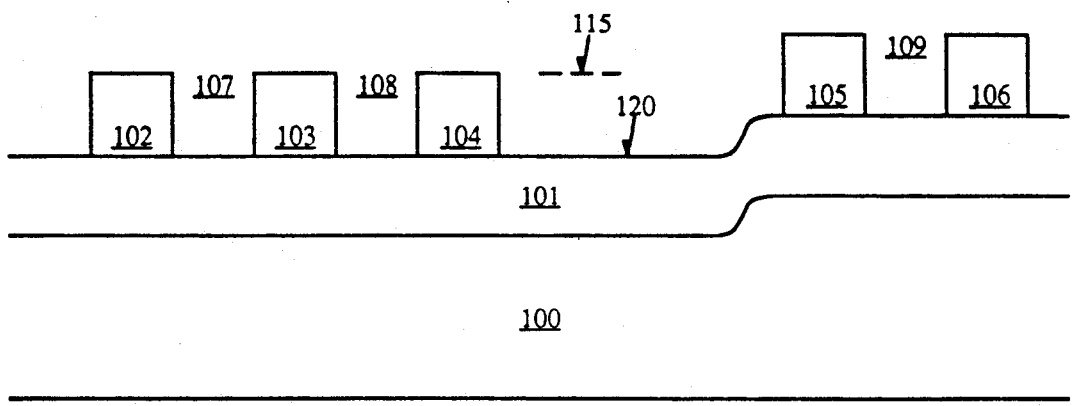
FIG. 1 shows a typical patterned photoresist layer to be formed by the method and apparatus of the present invention.
Figure 2:
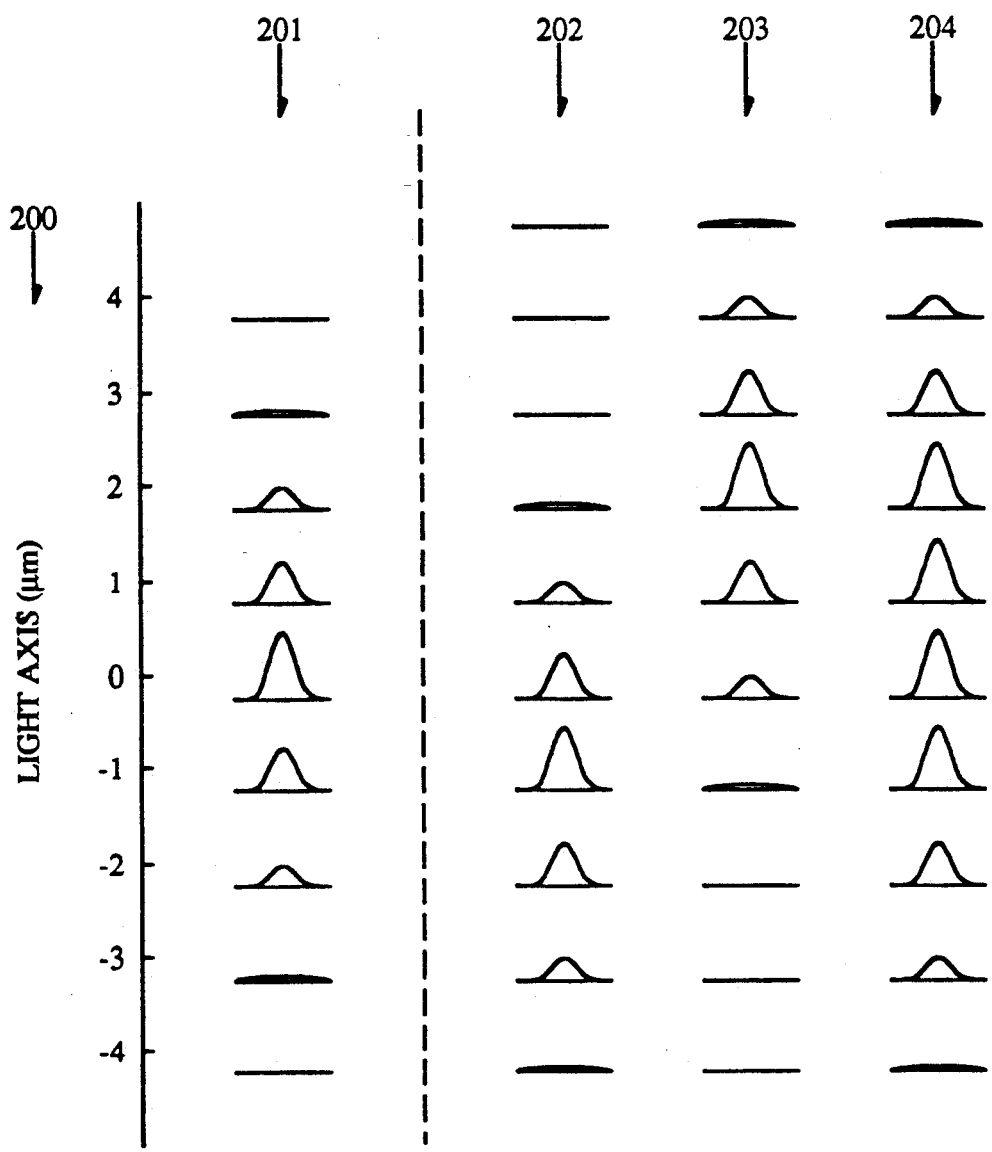
FIG. 2 shows radiation intensity distributions along the light axis for conventional and for enhanced focus latitude exposure.
Figure 3:
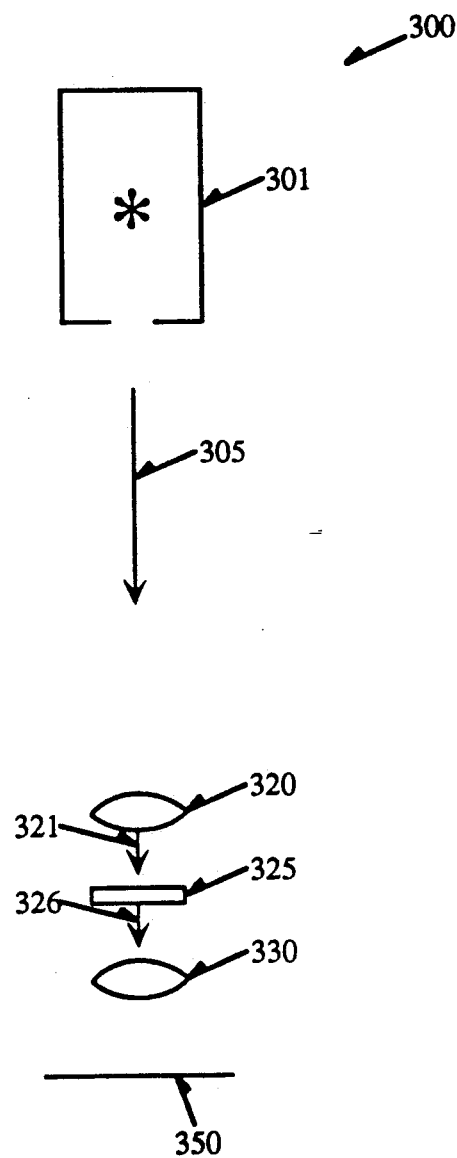
FIG. 3 shows a schematic diagram of an excimer laser lithography system.

FIG. 3 shows lithography system 300 of the present invention. In lithography system 300, the radiation source is excimer laser 301 which will be used to expose a photosensitive layer on semiconductor substrate 350 to the pattern contained on mask 325. Excimer laser 301 of the present invention is illustrated in, and described in conjunction with, FIG. 4, below. As will be described in detail below, laser 301 has a free running or broad band output, and a line narrowed output, which is a small portion of the free running output, and which is conventionally the output used for exposure. Excimer laser 301 in lithography system 300 can be used to expose a photosensitive layer using the conventional single line narrowed output, or can be used to practice the present invention, wherein a plurality of narrowed lines or bands of radiation are used to expose the photosensitive layer.

Figure 5:
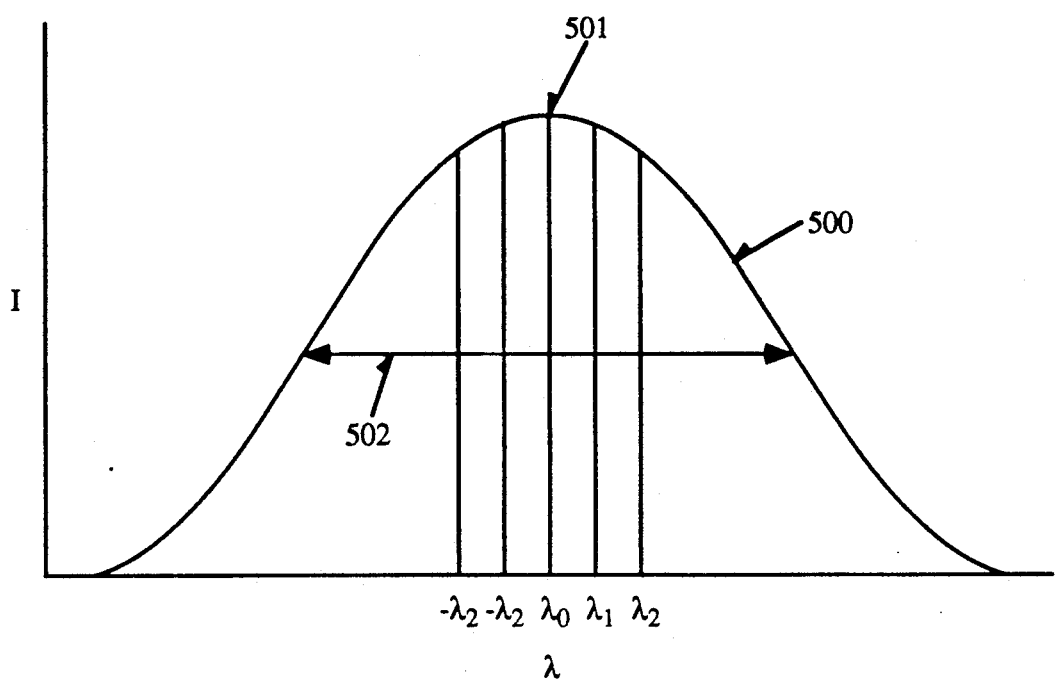
FIG. 5 shows a graph of the output of an excimer laser and several narrow bands of the output which may be utilized in the present invention.

Referring briefly to FIG. 5, an intensity distribution 500 of the free running radiation output of the excimer laser 301 of FIG. 3 is shown. In a currently preferred embodiment, the peak 501 of the intensity curve is centered approximately around the wavelength 248 nanometers (nm). The bandwidth of the intensity distribution 500 is in the range of approximately 0.3-0.5 nm (300-500 picometers (pm)). As used herein, bandwidth refers to the Full Width Half Maximum (FWHM) bandwidth, which is defined as the full width of the band at one half of the maximum intensity. For example, for the bandwidth 502 shown in FIG. 5, the arrows of the lines representing bandwidth 502 intersect intensity distribution 500 at points on the left and right hand side where the intensity is equal to one half the intensity value at the peak 501. (i.e., line 502 would intersect the y-axis at $1 = 1_{max}/2$). The bandwidth 502 is the distance between these points as shown. In a single pulse, laser 301 has a free running output of approximately 250-300 millijoules (mJ) per pulse in a currently preferred embodiment. However, typically, only a very small portion, such as that labeled $\lambda_0$ in FIG. 5 is used for exposure. Typically, the portion marked $\lambda_0$ has a bandwidth, as defined above, in the range of approximately 1-3 pm, and contains approximately 5% of the total energy output of laser 301. The portion $\lambda_0$ is an example of the line narrowed output described above. Generally, approximately 50 pulses are used to expose a resist layer. A greater number of pulses than is necessary for a complete exposure dose, with the output often attenuated for some or all of the pulses, is typically used in order to achieve dose control within 1% despite variations in energy output from pulse to pulse.

As described above, conventionally, a line narrowed output is used for exposure of the photoresist layer. This line narrowed output is typically obtained from a line narrowing module within the laser comprising one or more gratings, prisms, etalons and other optical elements in order to obtain the narrowed line. Referring back to FIG. 3, radiation 305 exiting laser 301, represents, generally, the output of laser 301, and may comprise one or more line narrowed outputs. If lithography system 300 is used to expose a resist layer using conventional methods, radiation 305 will comprise a single line or band, such as $\lambda_0$, described above. As will be described later, in accordance with the present invention radiation 305 will comprise a plurality of such bands of radiation.

Radiation 305 is directed into condensing lens 320, as shown. The radiation exiting condensing lens 320 strikes reticle 325 and is focused by projection lens 330 on the photoresist layer covering substrate 350. Such a narrow bandwidth of approximately $\leq 3$ pm is required because of chromatic aberration introduced by projection lens 330. Chromatic aberration is an optical phenomenon wherein different wavelengths are refracted to different degrees in a particular medium, such as a lens, which causes the different wavelengths to be focused at different positions along the light axis. In other systems, using higher wavelength radiation from a mercury vapor lamp, for example, an achromatic lens is used, which is a combination of elements of different refractive index which provide the desired focus, and reduction, if any, without chromatic aberration. However, for smaller wavelengths such as the 248 nm wavelength from an excimer laser, there are few materials from which a projection lens can be made. Presently, quartz is the only transparent material which can be manufactured with an acceptable defect level. Therefore, it is not practical to form an achromatic lens for deep UV and smaller wavelength lithography. Instead, the very narrow bandwidth of approximately 1-3 pm mentioned above is used to reduce the effects of chromatic aberration. This bandwidth can vary, and a greater bandwidth can be used to provide more energy per pulse, but correspondingly more chromatic aberration will be present, depending also upon the chromatic aberration coefficient of the lens 330. The chromatic aberration coefficient is a measure of the chromatic aberration introduced by a lens and is typically in the range of approximately 0.15-0.20 micron/pm. That is, a one pm shift in the exposing wavelength will result in a 0.15-0.20 micron change in the position of the focal plane along the light axis. In order to keep the focal plane of the image at a predetermined position, the wavelength of radiation 305 is continuously monitored and, for example, the position of a grating in the line narrowing module is adjusted so that radiation 305 reaching condensing lens 320 is of approximately constant wavelength. Typically, any drift in the exposing wavelength is kept to approximately $\leq 1.0$ pm.

As described above, the chromatic aberration that would occur by using relatively broad band radiation, such as the i-, h- or g- lines of a mercury vapor lamp can be overcome by use of readily available lens elements. While mercury vapor lamps do radiate some radiation having a wavelength in the range of the excimer laser used in the preferred embodiment of the present invention, such sources are typically not practical for exposure in this wavelength range, as a very broad band of energy, compared with that necessary when using an excimer laser, must be used. That is, the energy in a 1-3 pm band from a mercury vapor lamp would contain only a small amount of energy and therefore would require a correspondingly long exposure time. Conversely, use of a broad band of radiation, sufficient to expose the wafer within a reasonable time, would because of chromatic aberration, result in the same problem as that encountered when too many focal planes are used in the FLEX method described in the background section, wherein a relatively flat light intensity distribution of defocused images causes poor image contrast, particularly in line and space patterns. In other words, use of broad band radiation with a chromatic projection lens is analogous to numerous, closely spaced FLEX exposures.

Figure 4:
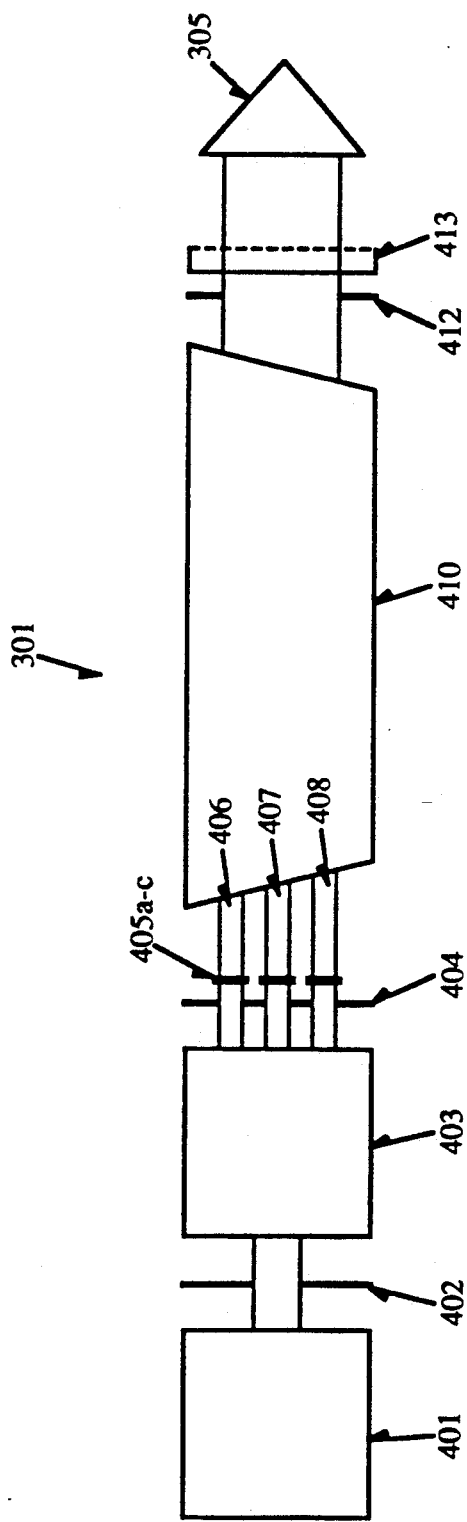
FIG. 4 shows a block diagram of an excimer laser according to the present invention.

FIG. 4 shows a currently preferred embodiment of a portion of laser 301 of the present invention. Line narrowing module 401 comprises, for example, gratings, prisms, etalons, and/or a combination of these and other optical elements, which select and narrow the bandwidth of radiation passing through aperture 402. Next, the narrowed output is expanded in beam expander 403, to facilitate the selection of the one or more line narrowed outputs to be used in the present invention. As shown in FIG. 4, aperture 404 passes three bands of radiation, 406, 407 and 408. It will be appreciated that the embodiment shown in FIG. 4, having three bands of radiation, is for purposes of illustration, and an embodiment with, for example, just two wavelengths, or embodiments having more than three wavelengths can be used as will be described below. In a currently preferred embodiment, each of the bands 406–408, has an attenuator, 405a, 405b and 405c, respectively, which can adjust the intensity of each band independently. It will be appreciated that in alternate embodiments having, for example, more than three bands of radiation, additional attenuators will be present to adjust the intensity of each band used. Next, the bands 406–408 pass through gain generator 410. As will be appreciated by one skilled in the art, radiation is reflected back and forth through modules 401-413 such that an amplified, coherent beam containing each band 406, 407 and 408 passes through aperture 412 and output coupler 413 to produce radiation 305, which in this case contains three bands of radiation, 406–408.

Referring again to FIG. 5, which shows the output of excimer laser 301, band 407 could be, for example, the line marked $\lambda_0$, while 406 could be $\lambda_1$, and 408 could be $-\lambda_1$. Additionally shown in FIG. 5 are $\lambda_2$ and $-\lambda_2$ which as described above, could also be injected into the light path along with additional bands if desired. The various bands of radiation are shown with an exaggerated spacing in FIG. 5. It will be appreciated that these bands are typically spaced more closely together than shown. The number of bands used, and the distance separating them will be discussed more fully in relation with FIG. 6, below.

Figure 6:
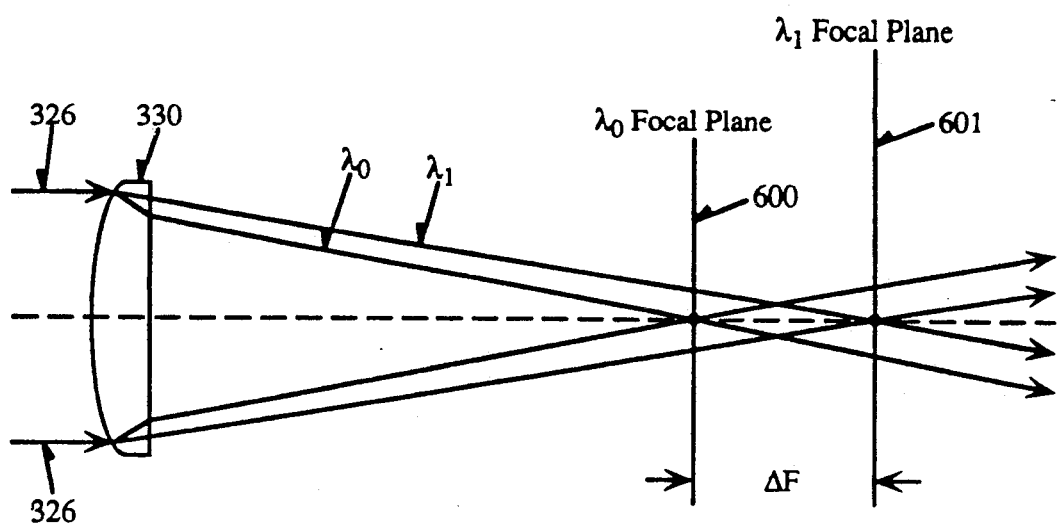
FIG. 6 shows a schematic diagram of a lens and two exposure wavelengths according to the present invention.

FIG. 6 illustrates the enhancement of focus latitude achieved by the present invention. For the purposes of clarity, only the images formed from two of the bands of radiation, for example, 407 and 406 of FIG. 4, corresponding to wavelengths $\lambda_0$ and $\lambda_1$ of FIG. 5, are shown. As shown in FIG. 6, radiation 326, which represents the exposing radiation after passing through condensing lens 320 and reticle 325 of FIG. 3, and which comprises all bands of radiation injected into the light path, strikes projection lens 330. As described earlier, quartz projection lens 330 has a chromatic aberration coefficient in the range of approximately 0.15-0.20 microns/pm. The chromatic aberration is due to the fact that the index of refraction of lens 330 is a function of wavelength, with the index decreasing with increasing wavelength. Therefore, shorter wavelength radiation such as $\lambda_0$ is bent to a greater extent than longer wavelength radiation such as $\lambda_1$ and focuses at a nearer point. As can be seen, the $\lambda_0$ focal plane 600 and $\lambda_1$ focal plane 601 are separated by a distance $\Delta F$. The distance will be equal to the difference in wavelength times the chromatic aberration coefficient. For example, if $\lambda_0$ is centered at a wavelength of 428.000 nm, and $\lambda_1$ is centered at a wavelength of 428.010 nm, for a difference of 0.010 nm (10 pm) and lens 430 has a chromatic aberration coefficient of 0.2 microns/pm, then $\Delta F$ will be 10 pm $\times$ 0.2 micron/pm = 2.0 microns. As can be seen from this example, then, in order to achieve a desired $\Delta F$, with a lens having a chromatic aberration coefficient of $C_{CA}$, the wavelengths used are chosen such that they have a center to center distance equal to $\Delta F/C_{CA}$. The above example is for purposes of illustration and is not meant to limit the present invention. It can be expected that improvements in lens design will lead to some systems having lenses with much smaller chromatic aberration coefficients. In such a case, a greater separation between exposing wavelengths could be used. On the other hand, improvements in selecting a narrow bandwidth (e.g., $\leq 1$ pm), will allow for more latitude in lens design, possibly resulting in systems with lenses having a much larger chromatic aberration, particularly in systems having a large NA. The number, and separation of wavelengths used to expose a wafer to a reticle will depend upon the desired focus latitude, and the characteristics of the pattern being imaged. For example, a pattern having many isolated openings, can withstand exposures at several different levels, without an unacceptable degradation of image contrast. Therefore, for example, all five of the lines $\lambda_0$, $\pm\lambda_1$, $\pm\lambda_2$ could be used to image such a pattern. In such a case, for example, using a lens 430 with a chromatic aberration coefficient of 0.2 microns/pm and choosing wavelengths separated by 10 pm, $\lambda_0$ could be focused at the average center of the photoresist layer, with $\lambda_1$ at $-2$ microns, $\lambda_2$ at $-4$ microns, $-\lambda_1$ at $+2$ microns and $-\lambda_2$ at $+4$ microns. This would provide for an exposure latitude of approximately 10–12 microns, with five sharply focused images spaced within 8 microns. In effect, use of several different wavelengths has the same effect as the FLEX method of exposing at different focal planes by moving the stage, and/or reticle and lens combination.

The number of different wavelengths, and their spacing should be optimized for each particular application. Closely spaced focal planes allow for high intensity levels, and therefore complete exposure in a shorter time throughout the portion of the resist in which the focal planes are present. However, if there are too great a number of closely spaced focal planes, some image blurring may occur, particularly with closely spaced features where interference from neighboring openings can be expected. Greater spacing between the planes provides for focused images at many different levels. However, if the planes are spaced relatively a large distance apart, regions between the focal planes may not be completely exposed. Typically, 2–5 focal planes spaced approximately 1–5 microns apart from each other will be satisfactory. As described previously, the number and spacing of bands of radiation (and therefore the number and spacing of focal planes) will depend on the particular lithography system, exposure wavelength and pattern being formed. Very small dimensions achieved by a large NA or a small wavelength require a small $\Delta F$, and future technologies may require that $\Delta F$ be well under 1 micron. Isolated patterns can withstand a greater number of focal planes, so that several, closely spaced wavelengths can be used for present and future isolated opening pattern requirements. While patterns such as line and space patterns cannot be patterned using as many focal planes as an isolated opening pattern, even with the addition of a single focal plane the focus latitude is enhanced. In addition, multilayer resist (MLR) and contrast enhanced lithography (CEL) processes can be used to improve image contrast in the present invention. Finally, although further miniaturization may require very close spacing of focal planes, the requisite focus latitude and therefore the total number of planes required, may be reduced by future planarization technologies. Generally, some experimentation will be necessary to determine the wavelengths, exposure dose, and required attenuation of each wavelength, for a given system and application.

Note that in the present invention, all focal planes are exposed simultaneously. Typically, as described above, with an excimer laser source, using a single band of radiation such as 406 of FIG. 4, only 5% of the total radiation is used, i.e., the small band of radiation emitted within the bandwidth of $\lambda_0$. However, since the present invention uses several bands, the photoresist layer receives a greater dose of radiation in a single exposure. Therfore, in contrast to the FLEX method, which increases throughput time and therefore decreases wafer throughput, the present invention results in a shorter exposure time, as the radiation in each wavelength band used exposes the wafer at different focal planes simultaneously. Because more energy than that present in a single 1–3 pm band of radiation is used, the present invention results in a decreased throughput time not only compared to the FLEX method, but also to conventional excimer laser lithography. Additionally, referring to FIG. 5, it can be seen that all wavelengths are of approximately equal intensity. The energy of all wavelengths can made to be more closely equal, (or if desired, can be adjusted so that one or more focal planes receives less energy) as desired, by the use of attenuators 405.

In lithography system 300 of FIG. 3, any number of bands of radiation of any bandwidth, and separated by any desired distance can be provided. If, in a given application it is desired to use only a single band, as in conventional lithography, or a select few of the bands provided, this can be accomplished through the system software. Also, in a preferred embodiment, the central wavelength (radiation 406 of FIG. 4, $\lambda_0$ of FIG. 5) is monitored and adjusted in line narrowing module 401 to keep $\lambda_0$ within a predetermined range. It is expected that any drift in the other exposure wavelengths will be close to that of the central wavelength, so that $\pm\lambda_1$, $\pm\lambda_2$, etc., do not need to be monitored. If desired, all exposure wavelengths can be monitored and adjusted. However, such a system will be more costly and complex. Finally, through use of, for example, shuttering, exposure by the selected bands can be performed sequentially. However, this alternative will require a greater throughput time compared with simultaneous exposure by all bands.

Although the present invention has been illustrated with a single excimer laser radiation source which emits radiation having a wavelength of approximately 248 nm, different types of radiation sources, more than one radiation source and other wavelengths can be used to practice the present invention. All that is necessary is the provision of two or more narrow radiation bands, focused by a lens having chromatic aberration, and differing in wavelength by the desired $\Delta F$ divided by the chromatic aberration coefficient of the lens.

Thus, a novel method and apparatus for increasing the focus latitude in a lithography system has been described. The present invention provides for a plurality of exposure wavelengths at a plurality of focal planes during a single exposure, thereby providing for the enhanced focus latitude with a decrease in total exposure time required. Additionally, the necessity of movement of the substrate relative to the exposure optics required in the prior art FLEX method, and its consequent throughput time increase and misalignment potential, is obviated by the present invention.

What is claimed is:

1. A method of patterning a photosensitive layer comprising:
   irradiating a mask having a pattern thereon with a plurality of bands of radiation, each of said bands having a bandwidth;
   passing at least some of said radiation in each of said plurality of bands of radiation through a lens, said lens having a chromatic aberration coefficient; and,
   forming a plurality of images of said pattern on said photosensitive layer, each of said images corresponding to one of said plurality of bandwidths and being focused at one of a plurality of focal planes.

2. The method as described in claim 1 wherein said plurality of bands of radiation comprise a first and a second band, said first and said second bands each having a center wavelength, said center wavelengths separated by a distance equal to a predetermined $\Delta F$ divided by said chromatic aberration coefficient, such that a first image is focused at a first focal plane, a second image is focused at a second focal plane, said first and said second focal planes separated by said predetermined $\Delta F$.

3. The method as described in claim 2 wherein said predetermined $\Delta F$ is in the range of approximately 0.25-5 microns.

4. The method as described in claim 1 wherein said plurality of bands of radiation are produced by an excimer laser.

5. The method as described in claim 2 wherein said plurality of bands of radiation are produced by an excimer laser.

6. The method as described in claim 3 wherein said plurality of bands of radiation are produced by an excimer laser.

7. The method as described in claim 1 wherein said bandwidth of each of said bands of radiation is approximately 3 pm or less.

8. The method as described in claim 2 wherein said bandwidth of each of said bands of radiation is approximately 3 pm or less.

9. The method as described in claim 3 wherein said bandwidth of each of said bands of radiation is approximately 3 pm or less.

10. The method as described in claim 1 wherein said chromatic aberration coefficient is in the range of approximately 0.05-0.50 micron/picometer.

11. The method as described in claim 2 wherein said chromatic aberration coefficient is in the range of approximately 0.05-0.50 micro/picometer.

12. The method as described in claim 3 wherein said chromatic aberration coefficient is in the range of approximately 0.05-0.50 micron/picometer.

13. The method as described in claim 1 wherein said plurality of bands of radiation have a wavelength in the range of approximately 100-300 nm.

14. The method as described in claim 2 wherein said plurality of bands of radiation have a wavelength in the range of approximately 100-300 nm.

15. The method as described in claim 3 wherein said plurality of bands of radiation have a wavelength in the range of approximately 100-300 nm.

16. The method as described in claim 1 wherein said plurality of images are formed simultaneously.

17. A lithographic system comprising:
    means for providing a plurality of bands of radiation, each of said plurality of bands having a bandwidth;
    means for irradiating a reticle having a pattern with said plurality of bands of radiation;
    a lens, said lens having a chromatic aberration coefficient, said lens forming a plurality of images of said pattern, each of said images corresponding to one of said plurality of bands of radiation and being focused at one of a plurality of focal planes.

18. The lithographic system as described in claim 17 wherein said means for providing said plurality of bands of radiation comprise:
    a radiation source, said radiation source emitting source radiation having a source bandwidth; and
    means for selecting and narrowing said source radiation to provide said plurality of bands of radiation.

19. The lithographic system as described in claim 17 wherein said plurality of bands of radiation comprise a first and a second band, said first and said second bands each having a center wavelength, said center wavelengths separated by a distance equal to a predetermined $\Delta F$ divided by said chromatic aberration coefficient, such that a first image is focused at a first focal plane, a second image is focused at a second focal plane, said first and said second focal planes separated by said predetermined $\Delta F$.

20. The lithographic system as described in claim 18 wherein said plurality of bands of radiation comprise a first and a second band, said first and said second bands each having a center wavelength, said center wavelengths separated by a distance equal to a predetermined $\Delta F$ divided by said chromatic aberration coefficient, such that a first image is focused at a first focal plane, a second image is focused at a second focal plane, said first and said second focal planes separated by said predetermined $\Delta F$.

21. The lithographic system as described in claim 19 wherein said predetermined $\Delta F$ is in the range of approximately 0.25-5 microns.

22. The lithographic system as described in claim 20 wherein said predetermined $\Delta F$ is in the range of approximately 0.25-5 microns.

23. The lithographic system as described in claim 17 wherein said radiation source is an excimer laser.

24. The lithographic system as described in claim 18 wherein said radiation source is an excimer laser.

25. The lithographic system as described in claim 17 wherein said bandwidth of each of said bands of radiation is approximately 3 pm or less.

26. The lithographic system as described in claim 18 wherein said bandwidth of each of said bands of radiation is approximately 3 pm or less.

27. The lithographic system as described in claim 19 wherein said bandwidth of each of said bands of radiation is approximately 3 pm or less.

28. The lithographic system as described in claim 22 wherein said bandwidth of each of said bands of radiation is approximately 3 pm or less.

29. The lithographic system as described in claim 17 wherein said plurality of bands of radiation have a wavelength in the range of approximately 100–300 nm.

30. The lithographic system as described in claim 18 wherein said plurality of bands of radiation have a wavelength in the range of approximately 100–300 nm.

31. The lithographic system as described in claim 19 wherein said plurality of bands of radiation have a wavelength in the range of approximately 100–300 nm.

32. The lithographic system as described in claim 22 wherein said plurality of bands of radiation have a wavelength in the range of approximately 100–300 nm.

33. The lithographic system as described in claim 17 wherein said chromatic aberration coefficient is in the range of approximately 0.05–0.50 micron/picometer.

34. The lithographic system as described in claim 18 wherein said chromatic aberration coefficient is in the range of approximately 0.05–0.50 micron/picometer.

35. The lithographic system as described in claim 19 wherein said chromatic aberration coefficient is in the range of approximately 0.05–0.50 micron/picometer.

36. The lithographic system as described in claim 22 wherein said chromatic aberration coefficient is in the range of approximately 0.05–0.50 micron/picometer.

* * * * *